United States Patent
Chen et al.

(10) Patent No.: US 8,995,533 B2
(45) Date of Patent: Mar. 31, 2015

(54) METHOD AND APPARATUS FOR TRANSMITTING AND RECEIVING FEC FRAME HEADERS WITH VARIABLE HEADER MODULATION

(75) Inventors: Hou-Shin Chen, North Brunswick, NJ (US); Wen Gao, West Windsor, NJ (US)

(73) Assignee: Thomson Licensing, Boulogne-Billancourt (FR)

( * ) Notice: Subject to any disclaimer, the term of this patent is extended or adjusted under 35 U.S.C. 154(b) by 403 days.

(21) Appl. No.: 12/998,780

(22) PCT Filed: Dec. 10, 2009

(86) PCT No.: PCT/US2009/006489
§ 371 (c)(1),
(2), (4) Date: Jun. 1, 2011

(87) PCT Pub. No.: WO2010/068270
PCT Pub. Date: Jun. 17, 2010

(65) Prior Publication Data
US 2011/0235721 A1    Sep. 29, 2011

Related U.S. Application Data

(60) Provisional application No. 61/201,443, filed on Dec. 10, 2008, provisional application No. 61/201,805, filed on Dec. 15, 2008.

(51) Int. Cl.
*H04N 7/12* (2006.01)
*H04N 11/04* (2006.01)
(Continued)

(52) U.S. Cl.
CPC ........... *H04L 1/0072* (2013.01); *H03M 13/136* (2013.01); *H03M 13/6555* (2013.01);
(Continued)

(58) Field of Classification Search
None
See application file for complete search history.

(56) References Cited

U.S. PATENT DOCUMENTS 6,211,919 B1    4/2001    Zink et al.
6,426,978 B1 *  7/2002    Bottomley et al. ........... 375/265
(Continued)

FOREIGN PATENT DOCUMENTS

CN    1348310         5/2002
CN    1477831 A       2/2004
(Continued)

OTHER PUBLICATIONS

Hsinying Liang Etal: "A modified partial transmit sequence with PAPR reduction and error correction in 16-QAM OFDM systems" Intelligent Signal Processing and Communications System, 2008, ieee, Aug. 2, 2008, pp. 104.
(Continued)

*Primary Examiner* — Tyler W Sullivan
(74) *Attorney, Agent, or Firm* — Robert D. Shedd; Ronald Kolczynski

(57) ABSTRACT

A frame header of Forward Error Correction (FEC) is provided, suitable for using in the DVB-C2 Standard. In the DVB-C2 Standard, Adaptive Coding and Modulation (ACM) or Variable Coding and Modulation (VCM) is applied to each FEC block to provide as much flexibility as possible. As a result, a frame header is attached in front of each FEC frame to inform the coding rate, modulation type and physical layer pipe identifier. Besides the signaling of physical layer related information, the FEC frame header has to provide a structure so that it can be easily and reliably detected in the receiver. Motivated by the need in DVB-C2 Standard, an efficient and reliable FEC header suitable for DVB-C2 Standard is provided in at least one implementation in this disclosure that combines use of two different modulation types for the header information. In addition, the detection Method of the FEC header is described.

6 Claims, 6 Drawing Sheets

(51) Int. Cl.
*H04L 1/00* (2006.01)
*H03M 13/13* (2006.01)
*H03M 13/00* (2006.01)
*H04L 27/20* (2006.01)
*H04L 27/22* (2006.01)
*H04L 27/38* (2006.01)
*H04N 21/2383* (2011.01)
*H04N 21/438* (2011.01)

(52) U.S. Cl.
CPC ............ *H04L1/0003* (2013.01); *H04L 1/0057* (2013.01); *H04L 27/20* (2013.01); *H04L 27/22* (2013.01); *H04L 27/38* (2013.01); *H04N 21/2383* (2013.01); *H04N 21/4382* (2013.01)
USPC .................................................. 375/240.25

(56) References Cited

U.S. PATENT DOCUMENTS

| | | | |
|---|---|---|---|
| 6,590,889 B1 * | 7/2003 | Preuss et al. | 370/342 |
| 6,865,236 B1 | 3/2005 | Terry | |
| 6,868,075 B1 | 3/2005 | Narvinger et al. | |
| 7,627,058 B2 * | 12/2009 | Poberezhskiy | 375/308 |
| 8,238,436 B2 * | 8/2012 | Yang | 375/240.23 |
| 2002/0013926 A1 | 1/2002 | Kim et al. | |
| 2003/0058954 A1 | 3/2003 | He | |
| 2004/0252725 A1 | 12/2004 | Sun et al. | |
| 2006/0077947 A1 | 4/2006 | Kim et al. | |
| 2007/0206638 A1 | 9/2007 | Santoru et al. | |
| 2007/0256001 A1 | 11/2007 | Suzuki et al. | |
| 2008/0184087 A1 | 7/2008 | Hayashi | |
| 2008/0192676 A1 | 8/2008 | Mantha | |
| 2008/0250294 A1 | 10/2008 | Ngo et al. | |
| 2009/0161788 A1 | 6/2009 | Giraud et al. | |
| 2010/0115277 A1 * | 5/2010 | Roscoe | 713/170 |
| 2010/0135335 A1 | 6/2010 | Matsumoto et al. | |
| 2010/0142461 A1 | 6/2010 | Miki et al. | |

FOREIGN PATENT DOCUMENTS

| | | | |
|---|---|---|---|
| CN | 101150574 | | 3/2008 |
| CN | 101222290 | A | 7/2008 |
| EP | 0782292 | | 7/1997 |
| EP | 0868082 | | 9/1998 |
| EP | 1487146 | | 12/2004 |
| JP | 10304322 | A | 11/1998 |
| JP | 2003158519 | A | 5/2003 |
| JP | 2004357323 | A | 12/2004 |
| JP | 20056338 | A | 1/2005 |
| JP | 2005210211 | A | 8/2005 |
| JP | 2005260600 | A | 9/2005 |
| JP | 2005260611 | A | 9/2005 |
| JP | 2007228598 | A | 9/2007 |
| JP | 2007259422 | A | 10/2007 |
| JP | 2008510423 | A | 4/2008 |
| JP | 2008182648 | A | 8/2008 |
| JP | 2008278188 | A | 11/2008 |
| WO | WO 99/07089 | | 2/1999 |
| WO | WO2005006693 | A1 | 1/2005 |
| WO | WO 2007/042685 | | 4/2007 |
| WO | WO 2007/148863 | | 12/2007 |
| WO | WO2008123024 | A1 | 10/2008 |

OTHER PUBLICATIONS

Mehdi Nouri Etal: "TEDS: a High Speed Digital Mobile Communication Air Interface for Professional Users Part 1: Overview of Physical Layer", Vehicular Technology Conference, 2007, IEEE, Apr. 1, 2007, pp. 959-963.

CCSDS et al: "DVB-S2 coding & modulation standard use for high data rate TM links. Experimental Specification" Internet Citation, Jun. 2007.

Search Report Dated Apr. 20, 2010.

Park et al., "Efficient Multicast Video Streaming for IPTV Service Over WLAN Using CC-FEC", 2008 International Conference on Internet Computing in Science and Engineering, 2008.

Paterson et al., "Efficient Decoding Algorithms for Generalised Reed-Muller Codes", 2008 International Conference on Internet Computing in Science and Engineering, Nov. 1, 1998, pp. 1-26.

* cited by examiner

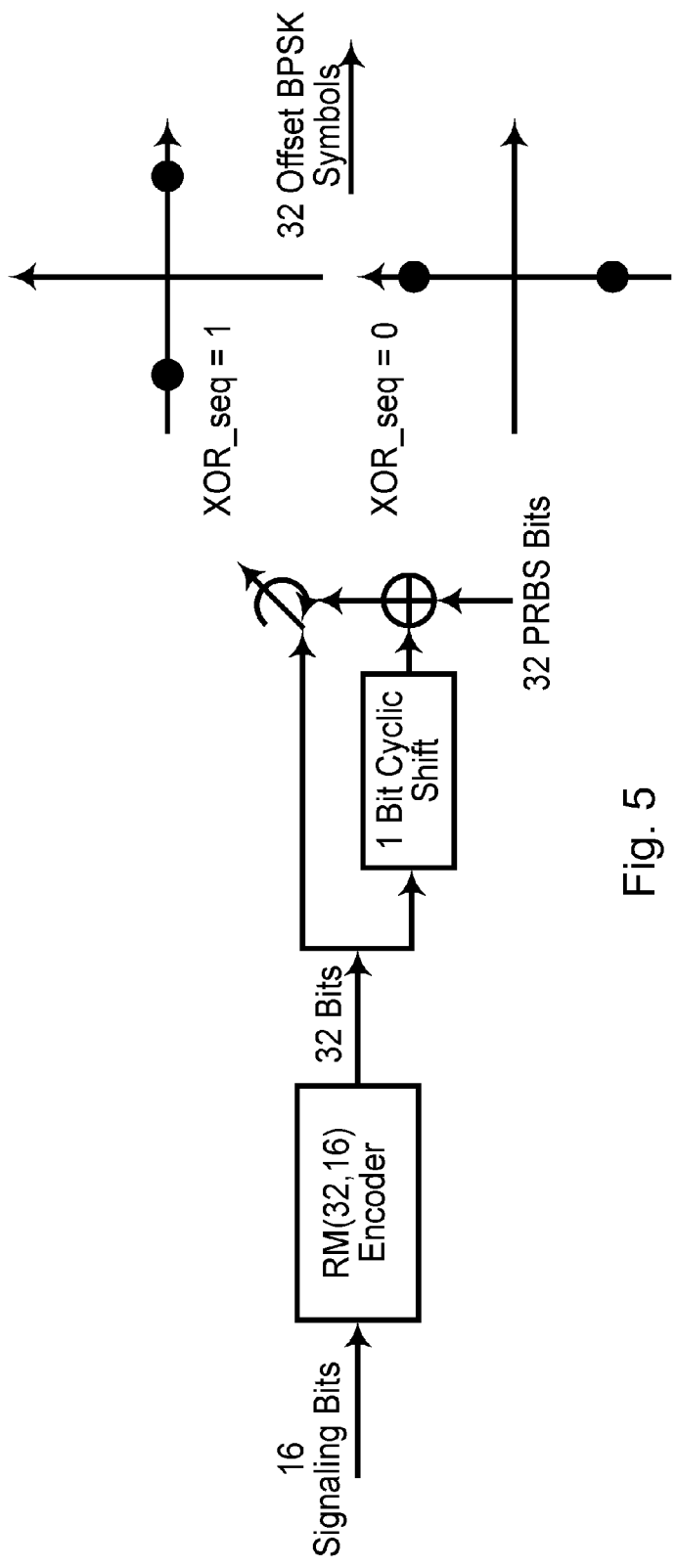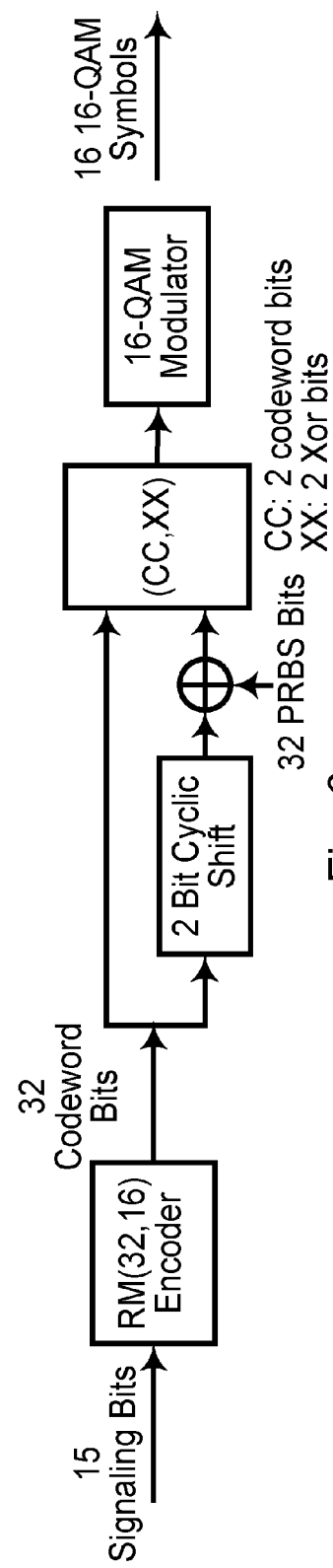
Fig. 5
Fig. 6

METHOD AND APPARATUS FOR TRANSMITTING AND RECEIVING FEC FRAME HEADERS WITH VARIABLE HEADER MODULATION

CROSS-REFERENCE TO RELATED APPLICATIONS

This application claims the benefit, under 35 U.S.C. §365 of International Application PCT/US2009/006489, filed Dec. 10, 2009, which was published in accordance with PCT Article 21(2) on Jun. 17, 2010 in English and which claims the benefit of U.S. provisional patent application No. 61/201,443, filed Dec. 10, 2008 and U.S. provisional patent application No. 61/201,805, filed Dec. 15, 2008.

TECHNICAL FIELD

The present principles relate to cable transmission systems and techniques. More particularly, it relates to a Forward Error Correction (FEC) header design for cable television transmissions.

BACKGROUND OF THE INVENTION

LDPC (Low Density Parity Check) codes are a class of Forward Error Correction (FEC) block codes, often used in transmission environments to protect audio and/or video data. These Forward Error Correction codes increase the possibility of receivers recovering from and correcting errors in a received multimedia stream, without the need to retransmit data that is received with errors. The FEC error control system requires the transmitter add redundant data to a data stream. The maximum fraction of errors that can be corrected by the FEC is determined by the way the error correction code is calculated. Examples of FEC are block codes, such as LDPC codes that work on fixed-sized blocks, packets, or symbols of a predetermined size, and convolutional codes that work on bit or symbol streams of arbitrary length. Many types of block error correction codes exist, such as Reed-Solomon or, as already mentioned, the LDPC (Low-Density Parity Check). Other types of error correction codes have been developed for specific use in transmission of digital video streams over IP networks, such as SMPTE 2022 (Society of Motion Picture and Television Engineers), which unlike other typical FEC schemes such as Reed-Solomon, relies on very simple algorithms, and is useful in environments where limited resources are available, such as a Set Top Box receiver for Digital Television.

The DVB-S2 LDPC codes family, which were originally designed for forward error control in satellite communications, have also been used by DVB-T2 (Second Generation Digital Video Broadcasting (DVBI Standard for Terrestrial Channels), and are strongly recommended for DVB-C2 (Second Generation DVB Standard for Cable Channels). OFDM modulation will be adopted as well as the coding technique (BCH+LDPC) specified in DVB-T2 Standard. However, DVB-T2 Standard is designed for use in the terrestrial wireless channel while the DVB-C2 Standard is designed for use in the cable channel. The signal frame structure and preambles used in DVB-T2 may not be suitable to be reused in DVB-C2 Standard.

A frame header of Forward Error Correction (FEC) is designed for use in the DVB-C2 Standard. The FEC data block is composed of a Bose-Chaudhuri-Hocquenghem (BCH) outer code and a Low-Density-Parity-Check (LDPC) inner code. Two dimensional interleaving is also performed. Interleaving is a procedure for rearranging the order of a sequence to fulfill different objectives. For channels subject to selective fading over time and frequency domains, bit and/or symbol interleaving have been used in conjunction with channel coding to distribute the error bursts. A frame header is attached in front of each FEC frame to indicate the coding rate, modulation type and physical layer pipe identifier. Besides the signaling of physical layer related information, the FEC frame header has to provide a structure so that it can be easily and reliably detected in the receiver.

SUMMARY OF THE INVENTION

An efficient and reliable FEC frame header for digital cable television transmission is provided in at least one implementation in this specification. The frame header is designed to be robust and detectable under noisy conditions. An exemplary implementation is shown, using the DVB-C2 standard as an example.

The efficient and reliable FEC frame header described herein is suitable for DVB-C2 Standard and is provided in at least one implementation in this specification. In the DVB-C2 Standard, Adaptive Coding and Modulation (ACM) or Variable Coding and Modulation (VCM) is applied to each FEC block to provide as much flexibility as possible. As a result, a frame header is attached in front of each FEC frame to indicate a receiver as to the coding rate, modulation type and physical layer pipe identifier. Besides signaling physical layer related information, it is desirable for the FEC frame header to provide a structure so that it can be easily and reliably detected in the receiver.

The number of symbols in the FEC frame header in an exemplary implementation in this specification is either 16 or 32, which is less than other methods having 45 symbols.

The FEC frame header according to the present principles uses Reed-Muller (32,16) Code (RM(32,16)) to protect signaling bits while the FEC frame header of prior methods use BCH (45,18) code. The RM(32,16) code has a symmetric code structure, so it can be decoded by majority-logic decoding which requires less complexity than previous decoding methods. Thus, the decoding complexity of the FEC frame header in an implementation according to the present principles is much less than decoding of a FEC frame header according to other known arrangements.

Additionally, improvements to both the 16 and 32 symbol FEC frame headers are provided to improve FEC frame header detection relative to prior methods.

BRIEF DESCRIPTION OF THE DRAWINGS

FIG. 4 shows the Generator Matrix of RM(32,16) code.

FIG. 5 shows a conceptual framework of a RM(32,16) encoder and generation of 32-symbol headers using a preferred embodiment of the present principles.

FIG. 6 shows an apparatus of a RM(32,16) encoder and generation of 16-symbol headers using a preferred embodiment of the present principles.

DETAILED DESCRIPTION OF THE INVENTION

The DVB-C2 Standard is the next generation digital cable transmission system being developed by the DVB Project. The DVB-C2 Standard uses aspects of the DVB-T2 terrestrial transmission standard as much as possible. As a result, OFDM modulation will be adopted as well as the coding technique (BCH+LDPC) specified in DVB-T2 Standard. However, it must be noted that DVB-T2 Standard is designed for use in the terrestrial wireless channel while the DVB-C2 Standard is designed for use in the cable channel. Cable channels differ from wireless channels because the cable channel is a high quality, high Signal-to-Noise Ratio (SNR) channel with only a few weak echoes and because the wireless spectrum assigned for TV broadcasting is generally defined by a governmental agency, such as the Federal Communications Commission (FCC), while the spectrum of the cable networks can be used with somewhat fewer limitations. Consequently, the signal frame structure and preambles used in DVB-T2 may not be suitable to be used in DVB-C2 Standard. The principles described herein allow an FEC frame header to be detected under noisy channel conditions with minimal receiver complexity.

The data transmitted according to the DVB-C2 standard is contained in Data Slice Packets. Data Slice Packets are formed from one or two FEC Frame cells. These Data Slice Packets can either be Data Slice Type 1 or Data Slice Type 2. Data Slice Type 1 packets only transmit the FEC Frame data and use a pointer within the Level 1 Signaling Part 2 to detect their start. Data Slice Type 2 packets carry a 16-bit FEC Frame header that allows for synchronization to the Data Slice Packets without further information being transmitted. This header carries information regarding the modulation, coding parameters, PLP (Physical Layer Pipe) identifiers, and number of FEC Frames (one or two) following the header. Encoding of the header information must ensure that the header can be properly synchronized and decoded.

Simulation results have shown that use of RM(32,16) code with BPSK (Binary Phase Shift Keying) modulation can achieve error free results for FEC Header signaling at 10 dB SNR in additive white Gaussian noise (AWGN) channels. Majority decoding has very low complexity leading to simple decoders as well.

FEC Frame Structure

Figure 1:
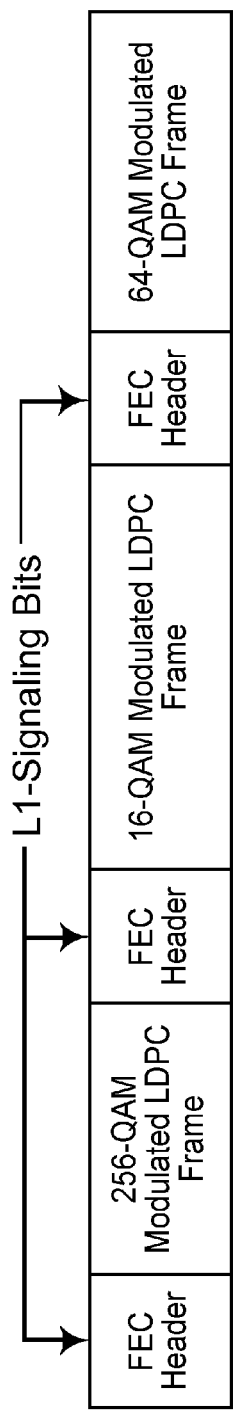
FIG. 1 shows the frame structure of the frequency-domain DVB-C2 signals.

In the DVB-C2 Standard, in order to support ACM or VCM over each FEC frame, a FEC frame header is attached to each FEC frame. The FEC frame structure is shown in FIG. 1. Each FEC-coded frame is Quadrature Amplitude Modulation (QAM) modulated with different order and coding rate. These two important parameters are carried in the FEC frame header that precedes each FEC frame.

The FEC frame header contains 16 signaling bits as described below:
1. QAM Modulation Order—3 bits (16, 64, 256, 1K, 4K)
2. FEC Block Length—1 bit (16200, 64800)
3. FEC Coding Rate—3 bits
4. Physical Layer Pipe (PLP) ID—8 bits
5. Header Change Indicator or parity check bit—1 bit: When the bit is Header Change Indicator, the value of "1" indicates the first 4 parts of the FEC header of next FEC frame will be modified while the value of "0" indicates no change. The receiver will know if the bit is the header change indicator or parity check bit based on layer-1 signaling.

The signaling bits are protected by RM code which can be decoded with a low-complexity majority-logic decoding method. The RM(32,16) code is selected and thus 16 message bits are coded into 32 codeword bits. A PRBS (Pseudo-Random Binary Sequence) of length 32 is embedded in the FEC frame header structure prior to modulation to enable frame header detection in the receiver. An example of a 32-bit PRBS bit is F8261D92 in hex notation. This PRBS is generated using a generating polynomial of $x^{11}+x^2+1$. Two frame header structures with different length are designed in at least one implementation in this description. The frame header structure with shorter length (16 symbols) is provided for use in a high SNR environment.

In one embodiment of the present principles, in order to improve detection of the FEC frame header, data portions employing 16-QAM and 64-QAM data symbols are used with 32-symbol headers, and 16-symbol headers otherwise (high-SNR case). One bit in the L1 signaling bits is used to indicate header type. The FEC frame header is modulated differently depending on the modulation of the data slice portion. When the data symbols are modulated with 16-QAM and 64-QAM modulation, the FEC header can be modulated using offset BPSK and otherwise modulated with 16-QAM. The 32-symbol header is reliable when the Signal-to-Noise Ratio (SNR) is above 10 dB, and the 16-symbol header is reliable when the SNR is above 20 dB. Use of both 32-symbol and 16-symbol headers in PLPs can be used to improve detection. However, in order to improve symbol header decoding at SNR of 10 dB, 32-symbol and 16-symbol headers are not used simultaneously in the same data slice within one DVB-C2 frame.

FIG. 1 shows an FEC frame structure which has different modulation being used for consecutive data portions. Under the present principles, the modulation employed for each FEC frame header would depend on the modulation employed by the corresponding data portion. In some cases, a 32-symbol FEC frame header would be employed and in other cases, the 16-symbol header would be used.

A. 32-Symbol FEC Frame Header

Figure 2:
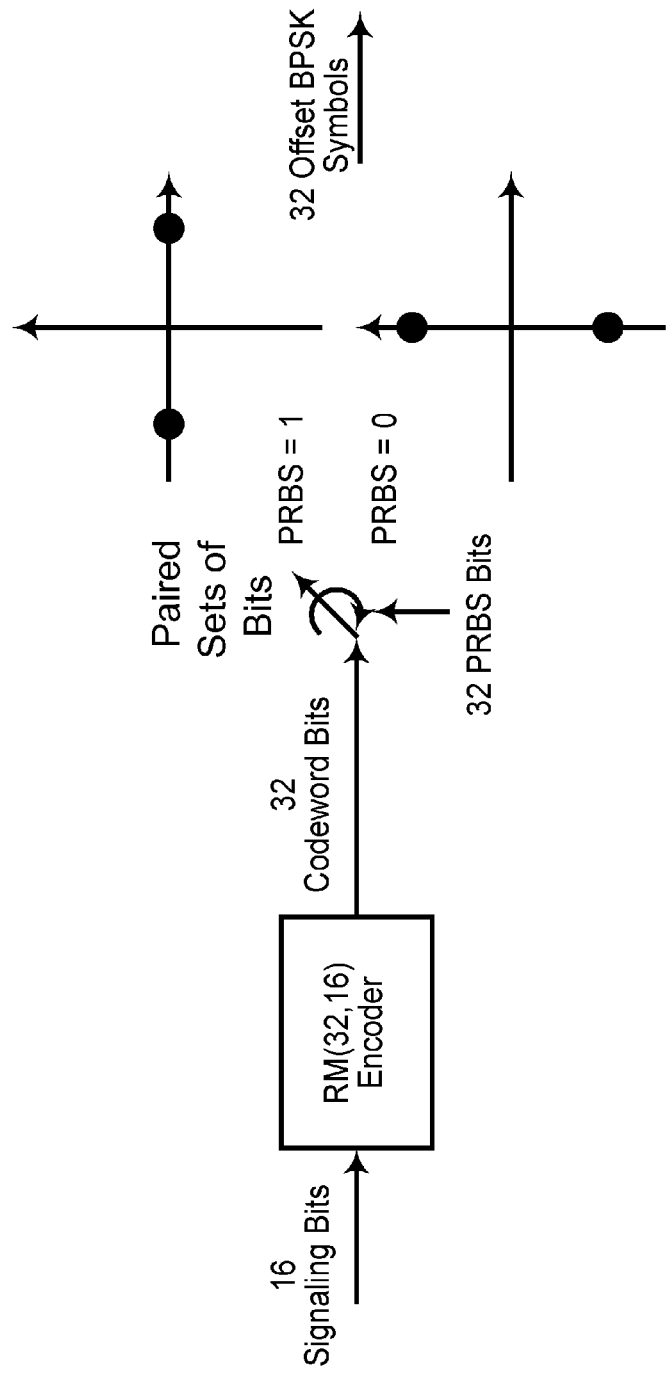
FIG. 2 shows a conceptual framework for generation of 32-Symbol FEC Frame Header.

A conceptual framework for generating a 32-Symbol FEC frame header is shown in FIG. 2. Under the present principles, this 32-symbol header is used when the PLP data portion is modulated with 16-QAM or 64-QAM data symbols. The 16 signaling bits are coded using RM(32,16) code. The resulting 32 codeword bits are modulated by offset BPSK in a modulator using a 32-bit PRBS.

In one embodiment of the present principles, the RM(32, 16) codeword undergoes a 1-bit cyclic shift and is exclusive-ORed with the 32-bit PRBS bits to form a sequence which is used to indicate the use of in-phase or quadrature BPSK. For example, when a bit of the exclusive-OR sequence is equal to 1, in-phase BPSK is used to modulate the 32 bits generated by the RM(32,16) encoder. When a bit of the exclusive-OR sequence is equal to 0, quadrature BPSK is used to modulate the 32 bits generated by the RM(32,16) encoder. A conceptual framework for generation of this type of 32-Symbol FEC frame header is shown in FIG. 5.

B. 16-Symbol FEC Frame Header

Figure 3:
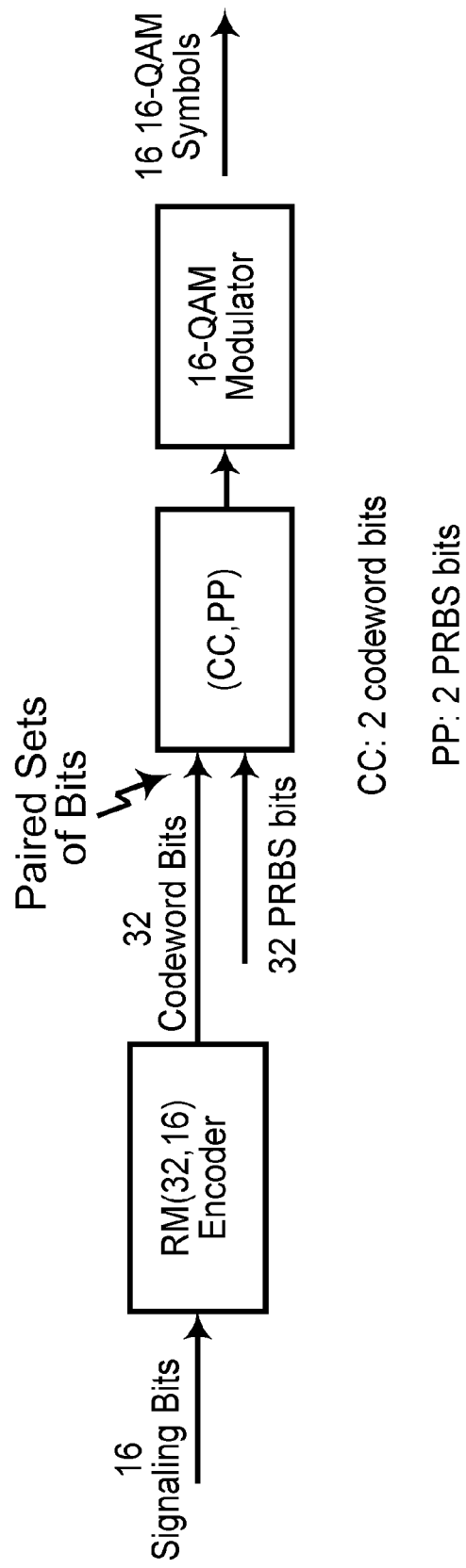
FIG. 3 shows an apparatus for generation of 16-Symbol FEC Frame Header.

An apparatus for generating a 16-Symbol FEC frame header is shown in FIG. 3. The 16 signaling bits are coded by RM(32,16) code. The resulting 32 codeword bits and 32 PRBS bits are 16-QAM modulated into 16 symbols by a 16-QAM modulator after every two codeword bits are paired with two PRBS bits. Each 16-QAM symbol is produced from two codeword bits in the two most significant bits and two PRBS bits in the two least significant bits. The two codeword bits determine the quadrant and the two PRBS bits determine the position in the quadrant. In another exemplary embodiment of a 16-QAM symbol, the two most significant bits carry the codeword bits and the two least significant bits carry the PRBS bits.

In another embodiment of the present principles, the RM(32,16) codeword undergoes a 2-bit cyclic shift and is then exclusive-ORed with the 32-bit PRBS bits. Each two bits of the exclusive-OR sequence are used as the two least significant bits of a symbol codeword. The two most significant bits of the symbol codeword are the two bits from the RM(32,16) encoder output. The two-bit cyclic shift ensures that the adjacent symbol also carries information of the two codeword bits in the current symbol to achieve diversity. The four-bit symbol codeword is modulated with 16-QAM to form 16 16-QAM symbols from each set of 16 signaling bits. The conceptual framework for generation of the 16-symbol headers using this principle is shown in FIG. 6.

In another preferred embodiment of the present principles, the 32-symbol header is modified using the 1-bit cyclic shift as described above, and the 16-symbol header is modified as described previously above so that both types of headers can be used, although not in the same data slice within a DVB-C2 frame. A bit in the L1 signaling data indicates the type of FEC frame header used in the Type 2 frame header.

Figure 7:
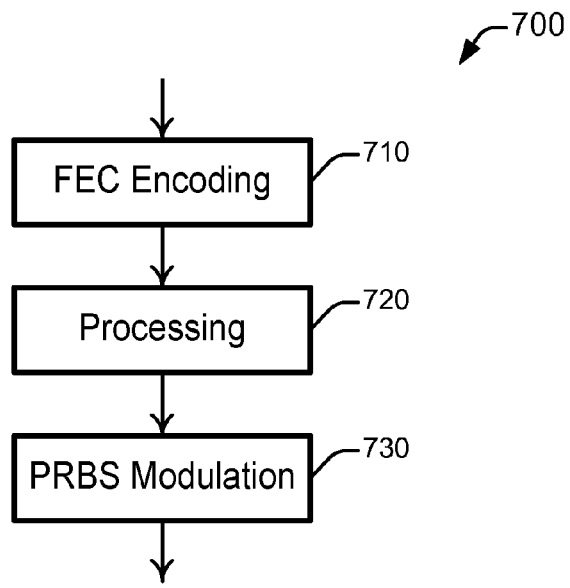
FIG. 7 shows a method for encoding a header using the principles described herein.

FIG. 7 illustrates the method 700 for encoding the FEC header information under the present principles. FEC Encoding is performed in step 710, using for example, RM(32,16) coding. Processing of the FEC encoded bits is performed in step 720 and depends upon the type of modulation that the header bits will undergo. Processing step 720 performs cyclic bit shifting of the RM encoded bits, followed by an exclusive-OR operation. The amount of the shift depends upon the type modulation used for the header bits. For the case of offset BPSK modulation, a one-bit cyclic shift of the RM encoded bits is performed, followed by an exclusive-OR of the shifted bits with a 32-bit PRBS. In the case of the 16-QAM modulation, two bits of the RM encoded bits are paired with two bits of the shifted RM bits exclusively-ORed with two of the PRBS bits.

Modulation with a pseudo-random binary sequence is then performed in step 730. Under one embodiment of the present principles, step 730 uses offset BPSK with the one-bit cyclic shift to create 32 symbols for the FEC header signaling bits when the data symbols in the physical layer pipe (PLP) use 16-QAM or 64-QAM modulation. Otherwise, step 730 uses 16-QAM modulation with a 2-bit cyclic shift and creates 16 symbols for the 16 signaling bits of the FEC frame header when it is determined that the 16 symbol header is used, for example, when the data symbols in the PLP use 256-QAM, 1K-QAM, or 4K-QAM modulation.

Figure 8:
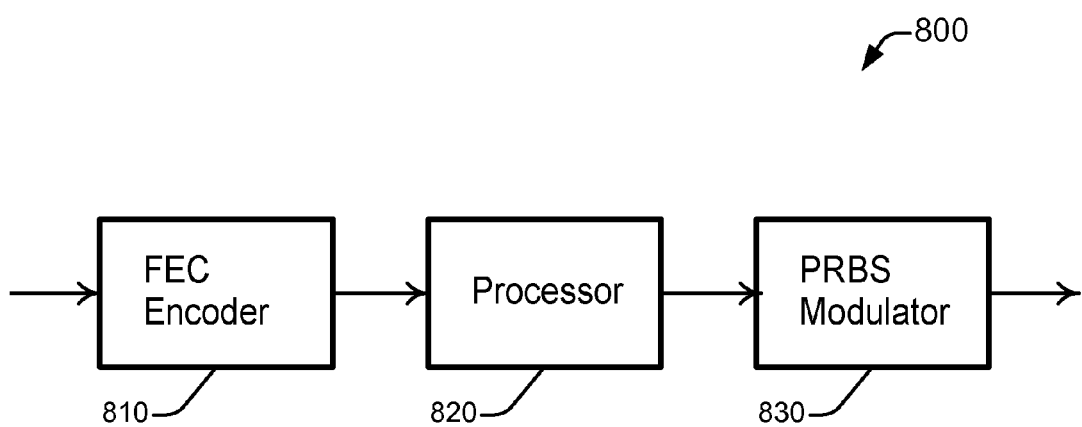
FIG. 8 shows an apparatus for encoding a header according to the principles herein.

FIG. 8 illustrates an apparatus 800 for encoding the FEC header information under the principles described herein. Header information is received at the input of encoder 810. After encoding, using for example RM(32,16) encoding, the output is sent to the input of processor 820, and then to modulator 830 where the FEC encoded header information is modulated with a pseudo-random binary sequence, using the appropriate modulation as described in method 700 and incorporating the principles described herein. Processor 820 performs cyclic bit shifting of the RM encoded bits, followed by an exclusive-OR operation. The amount of the shift depends upon the type of modulation used for the header bits. For the case of offset BPSK modulation, a one-bit cyclic shift of the RM encoded bits is performed, followed by an exclusive-OR of the shifted bits with a 32-bit PRBS. In the case of the 16-QAM modulation, two bits of the RM encoded bits are paired with two bits of the shifted RM bits exclusively-ORed with two of the PRBS bits.

FEC Frame Header Detection Method

Based on the PRBS embedded in the FEC frame header under the present principles and the use of RM(32,16) coding, the detection of the FEC frame header is performed by a two step method. The first step is the correlation of the transmitted PRBS and received bit-stream. Let $PN(n)$, $n=0, 1, \ldots, 31$ be the transmitted 32-bit PRBS. The correlation with a given index i is given by $$R_{PN}(i) = \sum_{n=0}^{31} PN(n) \cdot Y(i+n) \tag{1}$$

where $Y(n)$ is the received binary stream for PRBS. Note that the correlation of two binary streams is computed by substituting 1 and 0 to 1 and −1 and then performing correlation. Also note that if the PRBS is the only feature used for FEC frame header detection, the estimated FEC frame header position is given by $$i_o = \underset{i}{\mathrm{argmax}}\, R_{PN}(i) \tag{2}$$

The second step is based on the RM(32,16) code structure. Although the RM(32,16) code is not a first order Reed-Muller code, its codeword does not have a symmetric structure. However, during the majority-logic decoding process, after the first layer decoding, the modified codeword has a symmetry structure. This can be explained as follows: The codewords of RM(32,16) code are linear combinations of 16 rows of the generator matrix shown in FIG. 4.

$$x = (m_0, m_1, \ldots, m_{15})G. \tag{3}$$

The majority-logic decoding consists of 3 stages. The last 10 bits, $(m_6, m_7, \ldots, m_{15})$, are decoded from the received code vector $r=(r_0, r_1, \ldots, r_{15})$ in the first stage. These 10 bits are removed from r to form a modified code vector. Assume $r^{(1)} = (r_0^{(1)}, r_1^{(1)}, \ldots, r_{31}^{(1)})$ is the modified received vector $$r^{(1)} = r - (0, \ldots, 0, m_6, m_7, \ldots, m_{15})G. \tag{4}$$

Figure 4:
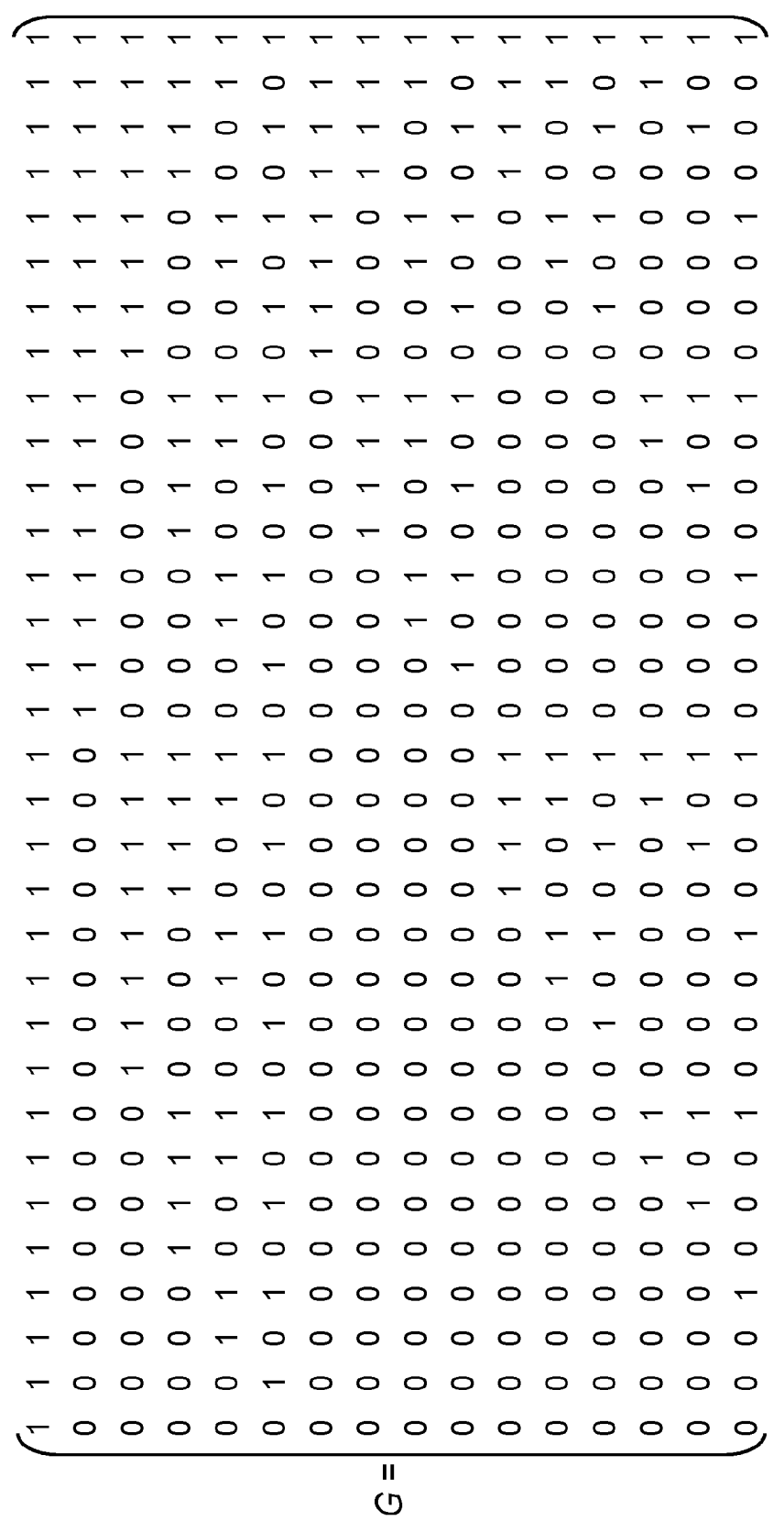

Let $x^{(1)} = (x_0^{(1)}, x_1^{(1)}, \ldots, x_{31}^{(1)})$ be its corresponding transmitted modified code vector. It can be seen that $x^{(1)}$ is a linear combination of the first 6 rows of the generator matrix of RM(32,16) code as shown in FIG. 4. It can be easily verified that $x^{(1)}$ has a symmetric structure. The sub-code vectors $(x_0^{(1)}, x_1^{(1)}, \ldots, x_{15}^{(1)})$ and $(x_{16}^{(1)}, x_{17}^{(1)}, \ldots, x_{31}^{(1)})$ are either the same or flipped. This kind of symmetry happens in sub-code vectors $(x_0^{(1)}, x_1^{(1)}, \ldots, x_7^{(1)})$ and $(x_8^{(1)}, x_9^{(1)}, \ldots, x_{15}^{(1)})$, $(x_{16}^{(1)}, x_{17}^{(1)}, \ldots, x_{23}^{(1)})$ and $(x_{24}^{(1)}, x_{25}^{(1)}, \ldots, x_{31}^{(1)})$, $(x_0^{(1)}, x_1^{(1)}, x_2^{(1)}, x_3^{(1)})$ and $(x_4^{(1)}, x_5^{(1)}, x_6^{(1)}, x_7^{(1)})$, and so on. Let $r^{(1)}(i) = (r_0^{(1)}(i), r_1^{(1)}(i), \ldots, r_1^{(1)}(i))$ be the received modified code vector which has index i as the starting position of FEC frame header. The RM autocorrelation of the received modified code vector is given by $$R_{RM}(i, k) = \sum_{m=0}^{2^k - 1} \sum_{n=0}^{2^{4-k} - 1} r^{(1)}_{m \cdot 2^{5-k} + n}(i) \cdot r^{(1)}_{m \cdot 2^{5-k} + 2^{4-k} + n}(i) \tag{5}$$

where k from 0 to 4 is an index for 5 symmetric structures embedded in $x^{(1)}$. In addition, define the RM symmetry measure as $$T_{RM}(i) = \sum_{k=0}^{4} |R_{RM}(i,k)|^2. \quad (6)$$

Figure 9:
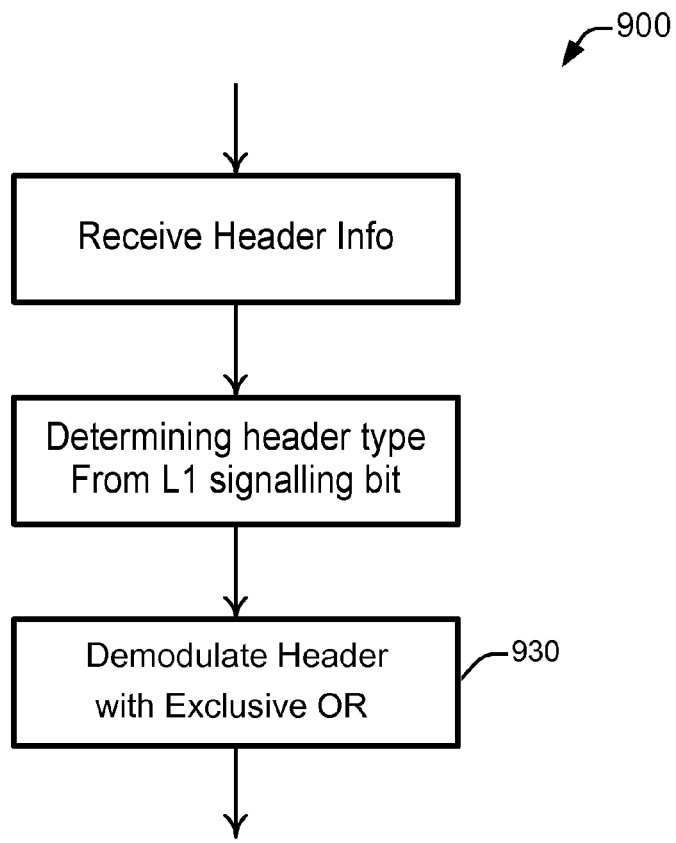
FIG. 9 shows a method for decoding the encoded header information according to the principles described herein.

Note that the RM symmetry measure can be computed for k=0 only to reduce complexity. The conceptual framework for detection of 32-Symbol FEC frame headers is similar to the conceptual framework for detection of 16-symbol FEC frame. The method 900 is shown in FIG. 9. One difference is in demodulating the information bits, step 930. For the 32-Symbol FEC header, the bit stream for PRBS correlation is decoded by comparing the amplitudes of real part and imaginary part of the received signal. For the 16-Symbol FEC header, the bit stream is from the 2 LSB of 16-QAM demodulator. A 32-bit PRBS correlation is then performed. The further RM correlation measure is performed only for those index i for which $R_{RM}(i)$ is greater than a threshold. This threshold is adjustable in the receiver. The decision statistic of the frame header detection is given by $$T = 5 \cdot |R_{PN}(i)|^2 + 4 \cdot T_{RM}(i) \quad (7)$$

Another variation for frame header detection is that the estimated frame header position is given by $$i_o = \underset{i}{\mathrm{argmax}}(5 \cdot |R_{PN}(i)|^2 + 4 \cdot T_{RM}(i)) \quad (8)$$

Figure 10:
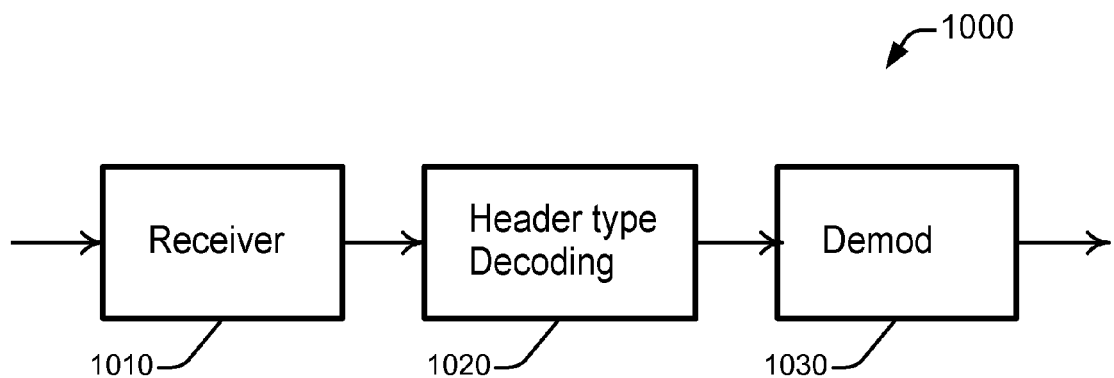
FIG. 10 shows an apparatus for decoding the encoded header information according to the principles described herein.

FIG. 10 shows an apparatus 1000 for decoding and demodulating the FEC frame headers under the present principles. Receiver 1010 receives the digital cable television information including the FEC frame header symbols and the L1 signaling information that indicates the type of modulation used for the header. Header decoder 1020 determines the header modulation and forwards this information, along with header symbols to demodulator 1030, which performs the appropriate demodulation for the 16-symbol header or the 32-symbol header.

We thus provide one or more implementations having particular features and aspects. However, features and aspects of described implementations may also be adapted for other implementations. Although implementations described herein may be described in a particular context, such descriptions should in no way be taken as limiting the features and concepts to such implementations or contexts.

The present description illustrates the present principles as applied to the 16-bit header of DVB-C2 as an example. It will thus be appreciated that those skilled in the art will be able to devise various arrangements that, although not explicitly described or shown herein, embody the present principles and are included within its spirit and scope. The present principles are equally applicable to header information of different lengths with appropriate modification of the methods and apparatus of the present invention.

The implementations described herein may be implemented in, for example, a method or process, an apparatus, or a software program. Even if only discussed in the context of a single form of implementation (for example, discussed only as a method), the implementation or features discussed may also be implemented in other forms (for example, an apparatus or program). An apparatus may be implemented in, for example, appropriate hardware, software, and firmware. The methods may be implemented in, for example, an apparatus such as, for example, a computer or other processing device. Additionally, the methods may be implemented by instructions being performed by a processing device or other apparatus, and such instructions may be stored on a computer readable medium such as, for example, a CD, or other computer readable storage device, or an integrated circuit. Further, a computer readable medium may store the data values produced by an implementation.

As should be evident to one of skill in the art, implementations may also produce a signal formatted to carry information that may be, for example, stored or transmitted. The information may include, for example, instructions for performing a method, or data produced by one of the described implementations.

Additionally, many implementations may be implemented in one or more of an encoder, a pre-processor to an encoder, a decoder, or a post-processor to a decoder. The implementations described or contemplated may be used in a variety of different applications and products. Some examples of applications or products include set-top boxes, cell phones, personal digital assistants (PDAs), televisions, personal recording devices (for example, DVRs (Digital Video Recorders), computers running recording software, VHS recording devices), camcorders, streaming of data over the Internet or other communication links, and video-on-demand.

Further, other implementations are contemplated by this specification. For example, additional implementations may be created by combining, deleting, modifying, or supplementing various features of the disclosed implementations.

All examples and conditional language recited herein are intended for pedagogical purposes to aid the reader in understanding the present principles and the concepts contributed by the inventor(s) to furthering the art, and are to be construed as being without limitation to such specifically recited examples and conditions.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The invention claimed is:

1. A method for encoding (Forward Error Correction) FEC frame header information for data packets, comprising:
   encoding header bits in the header information, used in a digital cable television transmission, for data packets using Reed-Muller encoding;
   processing the Reed-Muller coded header bits by performing a cyclic bit shift operation and an exclusive-OR operation with a pseudo-random binary sequence, using a one bit-shifted version of said Reed-Muller encoded bits exclusively-ORed with a pseudo-random binary sequence for generation of offset binary phase shift keying symbols and using a two bit-shifted version of said Reed-Muller encoded bits exclusively-ORed with a pseudo-random binary sequence for generation of 16-QAM (Quadrature Amplitude Modulation) symbols; and modulating the Reed-Muller coded header bits with a modulation type that depends upon the modulation type used to modulate data symbols in a corresponding data portion, and wherein said modulating step uses offset binary phase shift keying for a first type of header modulation and 16-QAM for a second type of header modulation.

2. The method of claim 1, wherein said modulating step is performed by modulating said Reed-Muller encoded bits using said exclusive-OR output bits for offset binary phase shift keying modulation and by modulating said Reed-Muller encoded bits using paired sets of bits comprising two said exclusive-OR output bits and two of said Reed-Muller encoded bits for 16-QAM modulation.

3. An apparatus for encoding FEC frame header information, comprising:

an encoder for header bits in the header information, used in a digital cable television transmission, for data packets using Reed-Muller encoding;

a processor for processing the Reed-Muller coded header bits by performing a cyclic bit shift operation and an exclusive-OR operation with a pseudo-random binary sequence and using a one bit-shifted version of said Reed-Muller encoded bits exclusively-ORed with a pseudo-random binary sequence for generation of offset binary phase shift keying symbols and a two bit-shifted version of said Reed-Muller encoded bits exclusively-ORed with a pseudo-random binary sequence for generation of 16-QAM symbols; and a modulator for modulating Reed-Muller coded header bits with a modulation type that depends upon the modulation type used to modulate data symbols in a corresponding data portion, and wherein said modulating step uses offset binary phase shift keying for a first type of header modulation and 16-QAM for a second type of header modulation.

4. The apparatus of claim 3, wherein the modulator modulates said Reed-Muller encoded bits using said exclusive-OR output bits for offset binary phase shift keying modulation and by modulating said Reed-Muller encoded bits using paired sets of bits comprising two said exclusive-OR output bits and two of said Reed-Muller encoded bits for 16-QAM modulation.

5. A method for decoding header information, the method comprising:

receiving a bitstream in a digital cable television transmission;

determining from bits encoded in the bitstream a type of modulation used for an FEC frame header from a digital cable television transmission;

demodulating said FEC frame header in response to the type of modulation determined from said encoded bits using a pseudo-random binary sequence with an offset binary phase shift keying for a header modulated with a first type of header modulation and a pseudo-random binary sequence with 16-QAM for a header modulated with a second type of header modulation, and performs an exclusive-OR operation of a bit-shifted version of said Reed-Muller encoded bits with a pseudo-random binary sequence, and wherein said exclusive-OR operation is performed with a one-bit cyclic shift of said Reed-Muller encoded bits for a binary phase shift keying modulated header and a two-bit cyclic shift of said Reed-Muller encoded bits for a 16-QAM modulated header.

6. An apparatus for decoding header information, comprising:

a receiver for receiving a bitstream in a digital cable television transmission;

circuitry for determining from bits encoded in the bitstream a type of modulation used for an FEC frame header from a digital cable television transmission;

a demodulator for demodulating said FEC frame header in response to the type of modulation determined from said encoded bits and wherein the demodulator uses a pseudo-random binary sequence with an offset binary phase shift keying for a header modulated with a first type of header modulation and a pseudo-random binary sequence with 16-QAM for a header modulated with a second type of header modulation, and wherein said demodulator performs an exclusive-OR operation of a bit-shifted version of said Reed-Muller encoded bits with a pseudo-random binary sequence, and wherein said exclusive-OR operation is performed with a one-bit cyclic shift of said Reed-Muller encoded bits for a binary phase shift keying modulated header and a two-bit cyclic shift of said Reed-Muller encoded bits for a 16-QAM modulated header.

* * * * *